(12) United States Patent
Kulsangcharoen et al.

(10) Patent No.: US 12,261,517 B2
(45) Date of Patent: Mar. 25, 2025

(54) H-BRIDGE CIRCUIT WITH BOOTSTRAP CAPACITOR GATE DRIVE CHARGING CIRCUIT

(71) Applicant: Hamilton Sundstrand Corporation, Charlotte, NC (US)

(72) Inventors: Ponggorn Kulsangcharoen, West Midlands (GB); Rodrigo Fernandez-Mattos, West Midlands (GB); Jonathan Roadley-Battin, Birmingham (GB)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 260 days.

(21) Appl. No.: 17/942,806

(22) Filed: Sep. 12, 2022

(65) Prior Publication Data

US 2023/0078379 A1 Mar. 16, 2023

(30) Foreign Application Priority Data

Sep. 15, 2021 (EP) ..................................... 21196998

(51) Int. Cl.
*H02M 1/08* (2006.01)
*H02M 7/5387* (2007.01)
*H02M 1/00* (2006.01)

(52) U.S. Cl.
CPC ........... *H02M 1/08* (2013.01); *H02M 7/5387* (2013.01); *H02M 1/0006* (2021.05)

(58) Field of Classification Search
CPC .... H02M 1/08; H02M 1/0006; H02M 7/5387; H03K 2217/0081
See application file for complete search history.

(56) References Cited

U.S. PATENT DOCUMENTS 6,246,296 B1 * 6/2001 Smith .................. H02M 7/538
326/88
6,489,758 B2 12/2002 Moriconi et al.
(Continued)

FOREIGN PATENT DOCUMENTS

CN 103647546 A 3/2014
JP 2010158117 A 7/2010

OTHER PUBLICATIONS

Abstract for JP2010158117 (A), Published: Jul. 15, 2010, 1 page.
European Search Report for Application No. 21196998.5, mailed Mar. 16, 2022, 8 pages.

*Primary Examiner* — Kyle J Moody
*Assistant Examiner* — Jye-June Lee
(74) *Attorney, Agent, or Firm* — CANTOR COLBURN LLP

(57) ABSTRACT

A bootstrap gate driver charging circuit arranged to drive the gate of an upper switch ($Q_U$) and a lower switch ($Q_L$) connected in series to provide an AC output voltage (400) voltage by alternatively turning on and off according to a predetermined duty cycle of alternate upper switch turn-on and lower switch turn-on phases, the bootstrap gate driver charging circuit comprising: an input terminal; an output terminal; an H-bridge inverter with an inverter input and an inverter output; a charging path; and a bootstrap capacitor. The input inverter is electrically connected to the input terminal, the inverter output is electrically connected to a first end of the bootstrap capacitor, the charging path is electrically connected between a second end of the bootstrap capacitor and a gate driver supply voltage; wherein in response to the lower switch being turned ON and providing a path to ground with respect to the supply voltage.

11 Claims, 4 Drawing Sheets

Method I: Applying pre-define pulse with number per cycle

(56) References Cited

U.S. PATENT DOCUMENTS

| | | | |
|---|---|---|---|
| 6,963,498 B2 | 11/2005 | Nadd | |
| 7,145,316 B1 * | 12/2006 | Galinski, III | H02M 1/08 |
| | | | 323/283 |
| 7,592,831 B2 | 9/2009 | Locatelli et al. | |
| 8,022,746 B1 | 9/2011 | Signoretti et al. | |
| 8,174,248 B2 | 5/2012 | Mavencamp et al. | |
| 8,456,867 B1 | 6/2013 | Karlsson et al. | |
| 9,407,192 B2 | 8/2016 | Sicard | |
| 9,590,608 B2 | 3/2017 | Xu | |
| 9,705,423 B1 | 7/2017 | Micic | |
| 9,774,275 B2 | 9/2017 | Perdikakis et al. | |
| 10,018,955 B2 | 7/2018 | Masaki | |
| 10,277,217 B2 | 4/2019 | Lakirovich et al. | |
| 10,340,906 B2 | 7/2019 | Sun et al. | |
| 10,944,270 B1 | 3/2021 | Kinzer et al. | |
| 2014/0103840 A1 * | 4/2014 | Lim | H02P 6/14 |
| | | | 318/400.28 |
| 2019/0341854 A1 | 11/2019 | Kohara | |

* cited by examiner

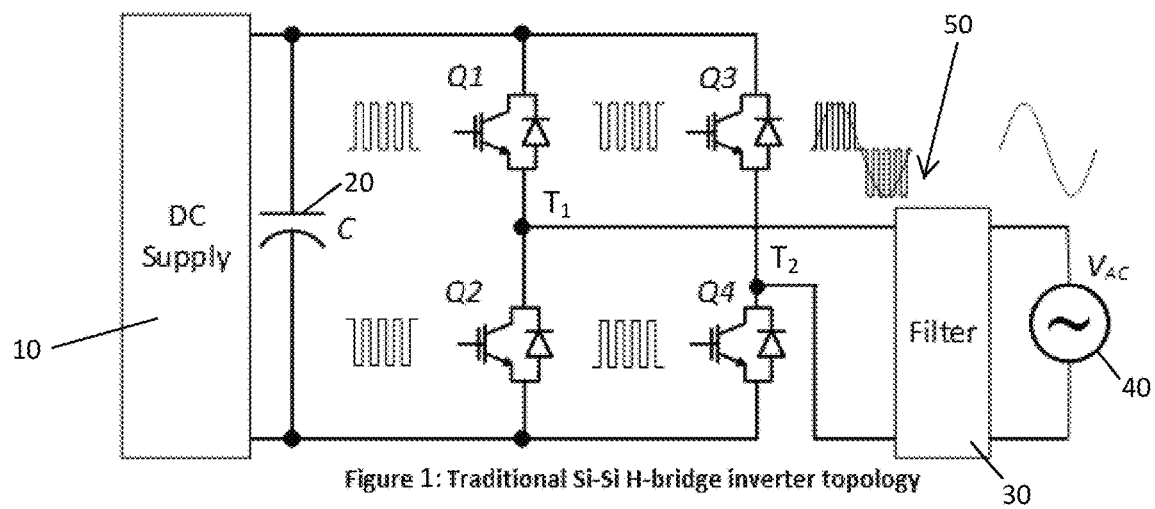
Figure 1: Traditional Si-Si H-bridge inverter topology
(Prior Art)
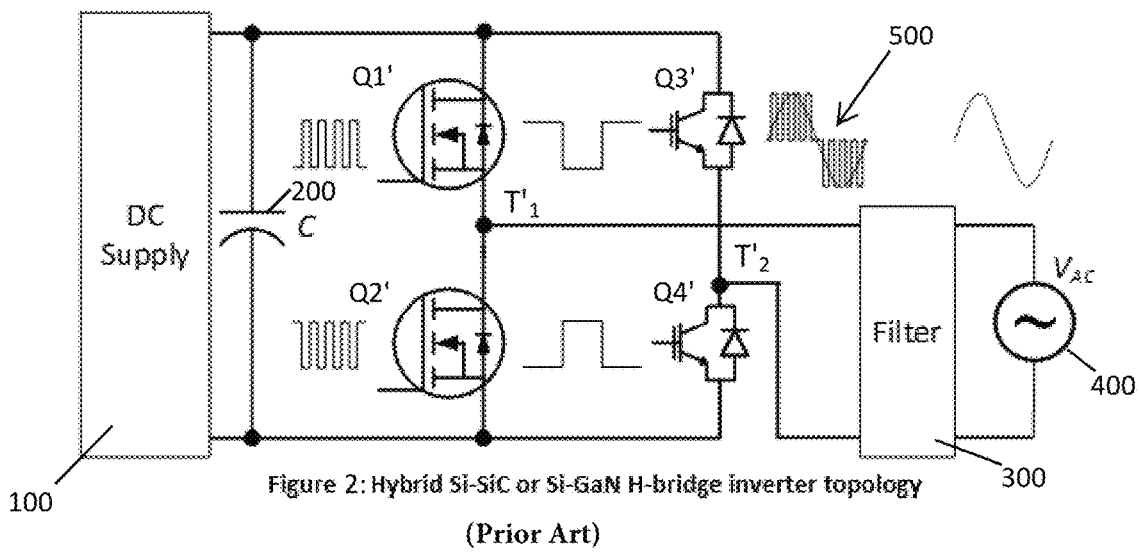
Figure 2: Hybrid Si-SiC or Si-GaN H-bridge inverter topology
(Prior Art)
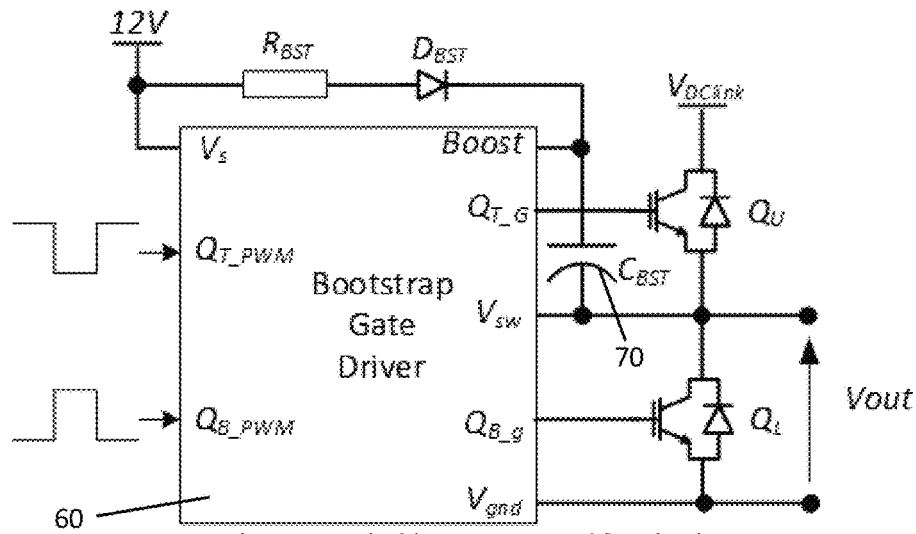
Figure 3: Typical bootstrap gate drive circuit
(Prior Art)

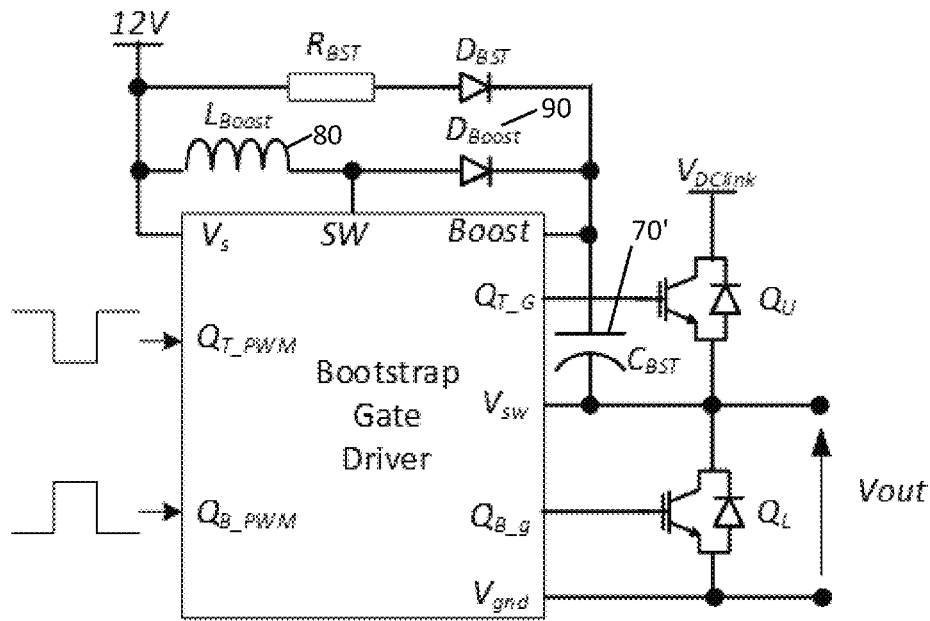
Figure 4: Bootstrap gate drive circuit with integrated boost converter (LT1336) [2]
(Prior Art)
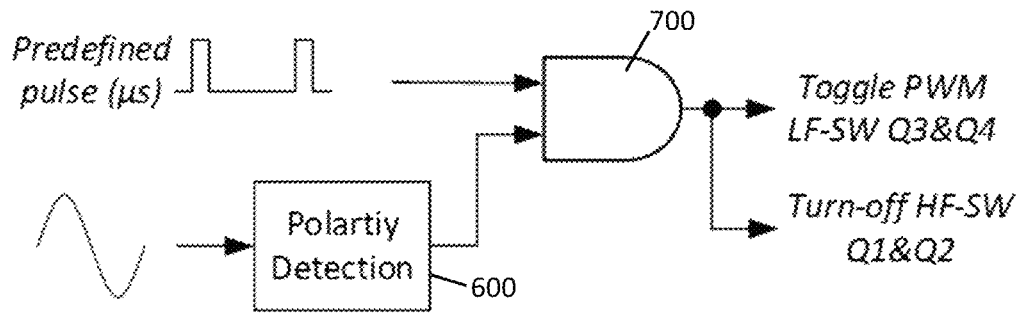
Figure 5: Method I: Applying pre-define pulse with number per cycle
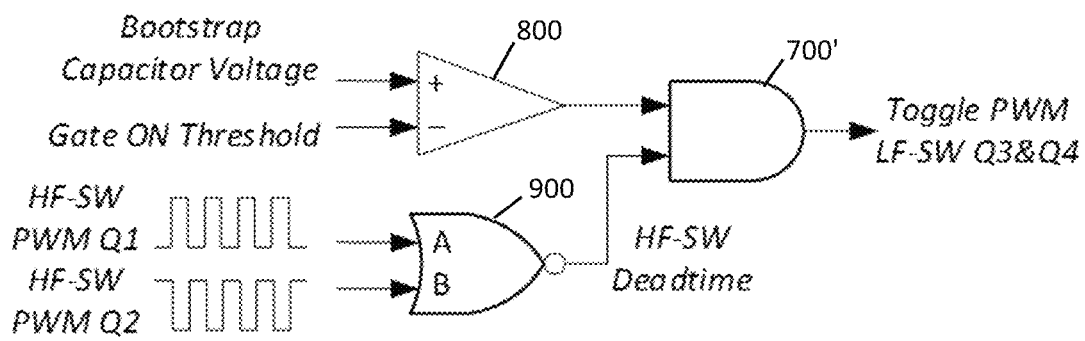
Figure 6: Method II: Top-up charge when it falls below the threshold

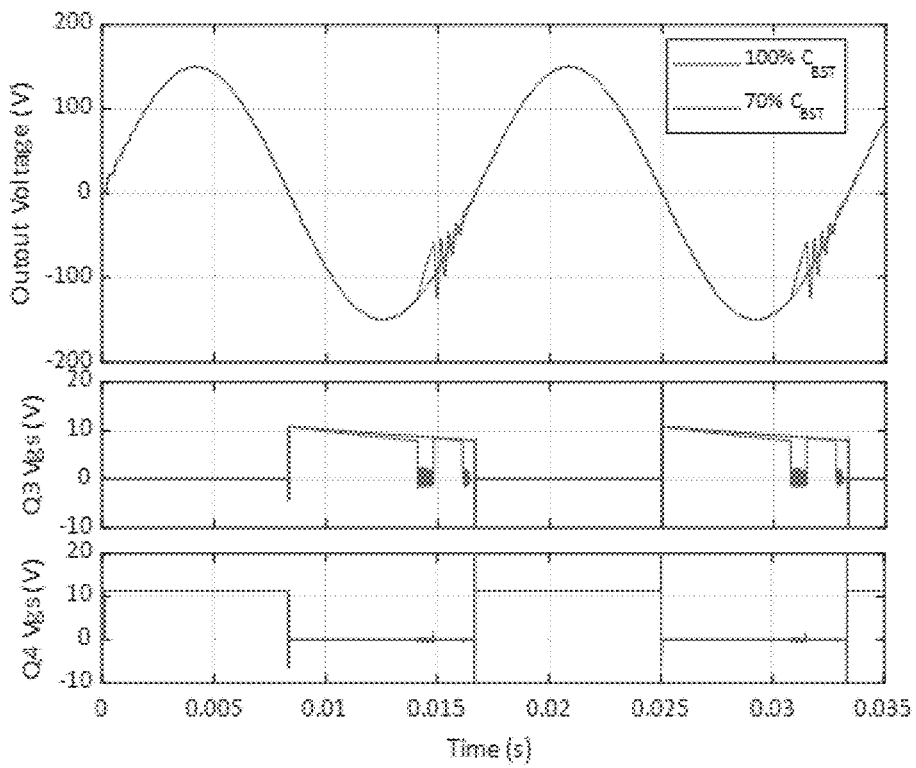
Figure 7A: Simulation result of Totem-pole inverter with 100% and 70% bootstrap capacitor conditions: (Top) Output voltage (Mid) Q3 gate voltage and (Bottom) Q4 gate voltage
(Prior Art)
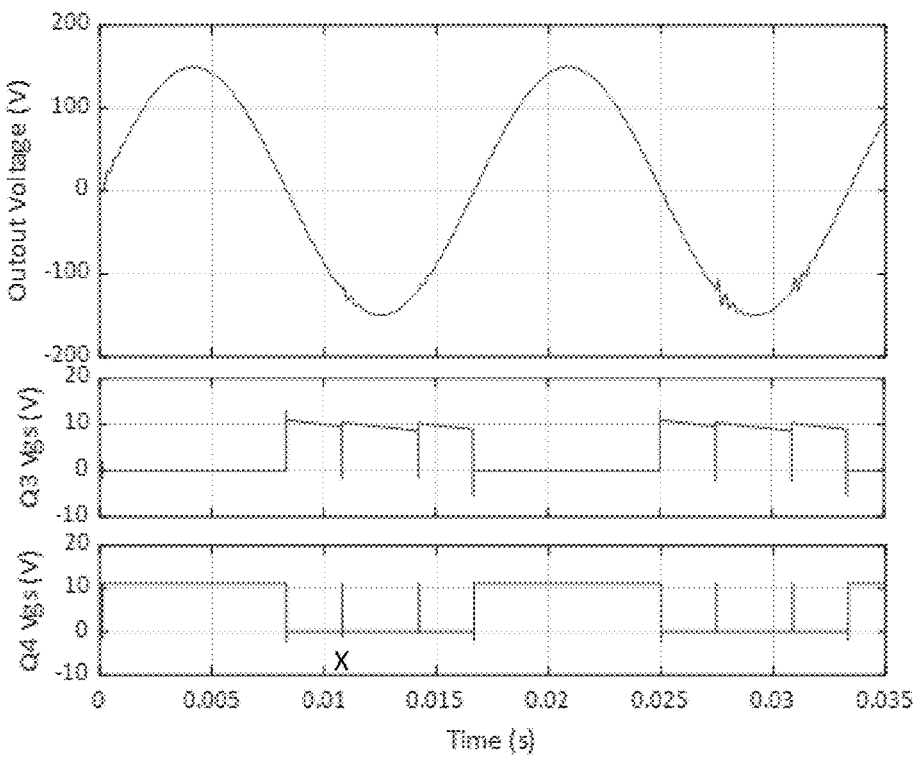
Figure 7B: Simulation result of Totem-pole inverter with 70% bootstrap capacitor with the technique: (Top) Output voltage (Mid) Q3 gate voltage and (Bottom) Q4 gate voltage

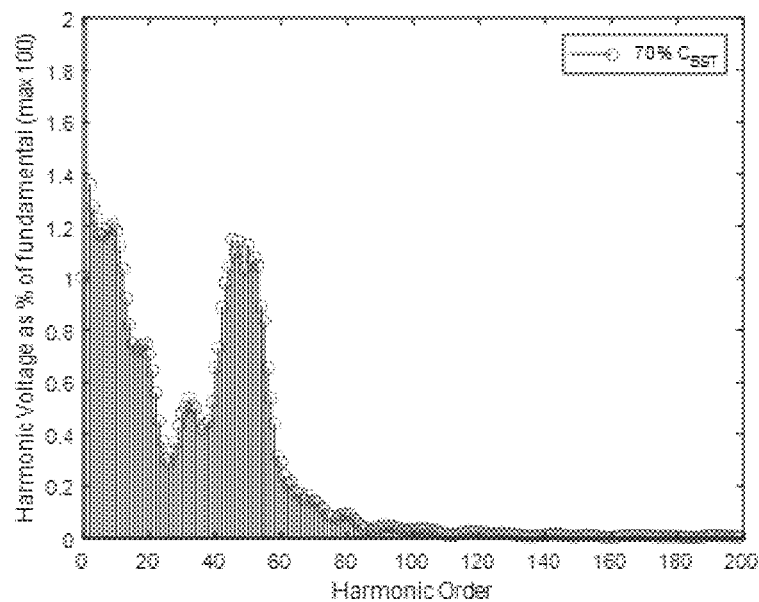
Figure 8A: FFT result of Totem-pole inverter harmonic output voltage with 70% bootstrap capacitor
(Prior Art)
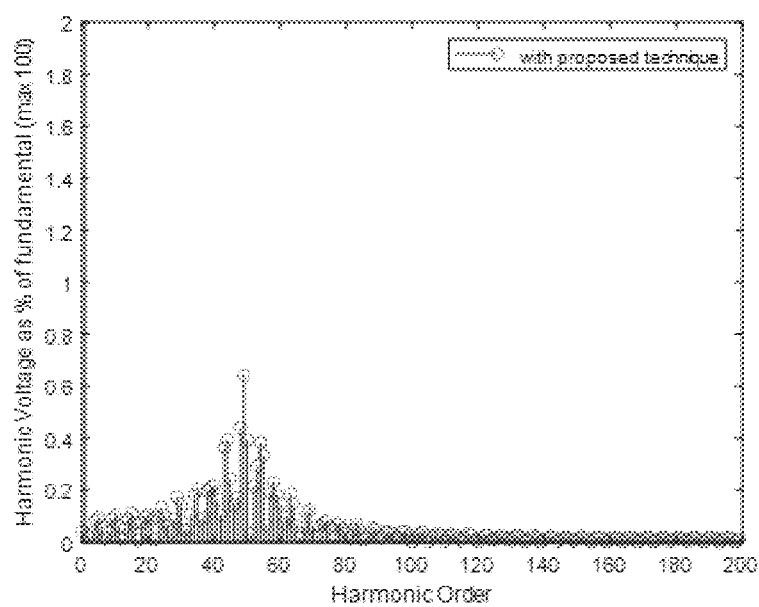
Figure 8B: FFT result of Totem-pole inverter harmonic output voltage with 70% bootstrap capacitor and the proposed technique

H-BRIDGE CIRCUIT WITH BOOTSTRAP CAPACITOR GATE DRIVE CHARGING CIRCUIT

CROSS REFERENCE TO RELATED APPLICATIONS

This application claims priority to European Patent Application No. 21196998.5 filed Sep. 15, 2021, the entire contents of which is incorporated herein by reference.

TECHNICAL FIELD

The present disclosure is concerned with a bootstrap circuit for a power switching or drive circuit.

BACKGROUND

There are many applications in which power from a power supply needs to be converted to a power appropriate for driving a load or loads. Many power conversion circuits, also known as drive circuits, use inverters to convert direct current (DC) power to AC power or vice versa. A rectifier may be provided to convert incoming grid AC power to a DC power that is applied to a DC bus that provides the DC input to the inverter circuitry. A common form of power circuit is known as an H-bridge circuit whereby a first set of two switches is electrically connected in series across a power supply and a second set of two switches, also connected in series, is connected in parallel with the first set of two switches. An AC output link is electrically connected between the switches of the sets of switches. The AC link typically has a terminal connected to each set of two switches, between series connected switches. Each terminal of the AC link can electrically connect the H-bridge to a motor phase winding (via a filter). Conventionally, in each set of switches, one switch is on when the other is off and when an upper (or high side) switch of the first set is on, the lower (or low side) switch of the second set is on and vice versa. Typical power converters with floating switches require either a floating power supply or use a bootstrap circuit to power the gate drive that controls the switches. Briefly, the bootstrap circuit includes a bootstrap capacitor that is charged when the high-side switches are switched off and the low-side switches are on, and when the low-side switches are off, the bootstrap capacitor discharges to the gate driver that powers the high-side switches.

Bootstrap circuits are preferable over floating power supplies because they are relatively small, simple and inexpensive. In high power applications, which usually employ large semiconductor switches that require significant charges to operate, or where the low-side switches are off for a relatively long time, however, the bootstrap capacitor may need to be a large component. Additional components such as buck converters or boost converters can be added to recharge the capacitor, but this also adds to the size of the overall system and reduces the efficiency of the system.

Conventional H-bridge inverters use similar types of semiconductor switches for the high-side and the low-side and for each leg of the H-bridge. Thus, both sets of switches switch on and off at the same rate. More recently, new semiconductor technologies have been developed and widebandgap semiconductors have become more widely available. This has allowed for hybrid H-bridge inverter topologies to be designed making use of e.g. SiC or GaN switches as one set of switches in the H-bridge while the conventional Si switches are used as the other set. With such hybrid topologies, the SiC/GaN switches will switch at a faster rate than the other set of switches. This allows the hybrid topology to exploit the low conduction loss properties of the Si switches as well as the low switching-frequency losses of the SiC/GaN switches. The low frequency switches will switch at a frequency within the grid frequency e.g. 50-60 Hz, while the switching frequency of the high frequency switches is in the range of hundreds kHz. The hybrid arrangement can still work with a conventional bootstrap circuit, but more charge is required to power the low frequency switch than the high frequency switch as it is turned on/off for a longer period of time. For such hybrid topologies, a bootstrap capacitor for the lower frequency switch would need to be very large, and much larger than that of the high frequency switch, to be able to hold sufficient charge to continuously power the low frequency switch during its on time.

There is, therefore, a need for improved bootstrap techniques, particularly for use with hybrid H-Bridge topologies.

SUMMARY

According to the disclosure, there is provided a bootstrap gate driver charging circuit arranged to drive the gate of an upper switch (QU) and a lower switch (QL) connected in series to provide an AC output voltage by alternatively turning on and off according to a predetermined duty cycle of alternate upper switch turn-on and lower switch turn-on phases, the bootstrap gate driver charging circuit comprising: an input terminal; an output terminal; an H-bridge inverter with an inverter input and an inverter output; a charging path, and a bootstrap capacitor; wherein the input inverter is electrically connected to the input terminal, the inverter output is electrically connected to a first end of the bootstrap capacitor, the charging path is electrically connected between a second end of the bootstrap capacitor and a gate driver supply voltage; wherein in response to the lower switch being turned ON and providing a path to ground with respect to the gate driver's supply voltage and in response to the lower switch being turned off, the charging circuit provides a sufficient voltage level to maintain the upper switch ON for the duration of the upper switch turn-on phase by toggling the upper and lower switches for a short period of time during the upper switch turn-on phase, so as to maintain the charge of the bootstrap capacitor during that phase.

The temporary toggling of the upper and lower switches may be performed using a logic circuit configured to detect the polarity of the output voltage and, in response to detection that the polarity is negative, applying a predefined pulse to reverse the ON/OFF states of the upper and lower switches for a predetermined short period of time.

In an alternative example, the temporary toggling of the upper and lower switches may be performed using a logic circuit configured to determine when the capacitor voltage falls below a predetermined threshold voltage and, in response thereto, reversing the ON/OFF states of the upper and lower switches for a predetermined short period of time.

The bootstrap gate driver circuit is for use in a hybrid H-bridge circuit.

BRIEF DESCRIPTION

Techniques according to the disclosure will be described in more detail by way of example only. Variation on the described examples are possible within the scope of the claims.

FIG. 1 shows an example of a conventional H-bridge inverter topology for a power converter.

FIG. 2 shows an example of a hybrid H-bridge inverter topology for a power converter.

FIG. 3 shows use of a conventional bootstrap circuit.

FIG. 4 shows use of a bootstrap circuit incorporating a boost converter.

FIG. 5 is an example of control logic for a modified bootstrap technique according to this disclosure.

FIG. 6 is an example of an alternative control logic for a modified bootstrap technique according to this disclosure.

FIG. 7A shows the low-side switch outputs and inverter output over time for a conventional bootstrap technique.

FIG. 7B shows the low-side switch outputs and inverter output over time for a modified bootstrap technique according to the disclosure.

FIG. 8A shows Fast Fourier Transform, FFT, analysis of the harmonic voltages for a conventional bootstrap technique.

FIG. 8B shows Fast Fourier Transform, FFT, analysis of the harmonic voltages for a modified bootstrap technique according to the disclosure.

DETAILED DESCRIPTION

The standard and hybrid H-bridge inverter topologies mentioned in the background, above, will be briefly described again with reference to FIGS. 1 and 2.

FIG. 1 shows a traditional Si—Si H-bridge topology comprising a first set of two semiconductor switches Q1, Q2 connected in series and a second set of Si—Si switches Q3, Q4 also connected in series and connected in parallel with the first set of switches to form an H-bridge. The bridge is connected across a DC link comprising a DC supply 10 and a DC link capacitor 20. The AC link 50 has a first terminal T1 connected at the junction between the two first switches Q1, Q2, and a second terminal T2 connected at the junction between the two second switches Q3, Q4 and provides, via a filter 30, an AC voltage output 40 to drive a load. The four switches Q1, Q2, Q3, Q4 switch on and off at the same frequency, with switches Q1 and Q4 switching in synch and switches Q2 and Q3 switching in synch. When switches Q1 and Q4 are on, switches Q2 and Q3 are off and vice versa.

FIG. 2 shows a hybrid Si—SiC or Si—GaN H-bridge topology comprising a first set of two SiC or GaN switches Q1', Q2' connected in series and a second set of Si switches Q3', Q4' also connected in series and connected in parallel with the first set of switches to form an H-bridge. The bridge is connected across a DC link comprising a DC supply 100 and a DC link capacitor 200. The AC link 500 has a first terminal T'1 connected at the junction between the two first switches Q1', Q2', and a second terminal T'2 connected at the junction between the two second switches Q3', Q4' and provides, via a filter 300, an AC voltage output 400 to drive a load. The first switches Q1', Q2' switch on and off at the same frequency, with switch Q1' on when switch Q2' is off. The second switches Q3' and Q4' switch on and off at a significantly lower frequency than the first switches.

As mentioned above, a bootstrap circuit is conventionally used to ensure that all upper (high side) switches are supplied with power at all times. FIG. 3 shows a simple bootstrap gate driver 60 which can be connected before the low frequency switches to provide a boost charge to the switch that is off at any one time. The design and operation of a conventional bootstrap circuit will be known to those skilled in the art, and will not be described here in detail. Briefly, a bootstrap circuit includes a bootstrap capacitor 70 associated with the leg of the H-bridge, and charging circuitry to control charging and discharging of the capacitor 70 based on the state of the switches QU, QL such that power is always provided to the upper switch QU of the leg when required. The bootstrap circuit is usually implemented with an H-bridge gate driver circuit that has two sets of series-connected switches (P-type and N-type) connected as a push-pull configuration. The mid-point between the two switches is connected to the gate of the H-bridge switch. The bootstrap capacitor 70 is connected across the two switches that drive the H-bridge upper switch. When the low side switch of the leg of the H-bridge is ON, current from the gate drive power supply flows through the bootstrap resistor RBST and the bootstrap diode DBST to charge the bootstrap capacitor 70 through the low side switch QU which connects to ground, and when the low side switch is OFF, the bootstrap capacitor remains connected to the gate driver of the high side switch and the capacitor discharges some of its energy to drive the gate of the high side switch to a sufficiently high voltage to switch the high side switch ON. Thus the charge is provided by the bootstrap capacitor 70 that charges from the on switch and discharges to power the off switch. A bootstrap circuit can be provided for each set of switches and will generally drive the upper of the two switches (Q3'—shown as Qu in FIG. 3) In FIG. 3, Q L represents the lower switch (Q4') in a switch set (Q3',Q4'). Where a high charge is required, rather than increasing the size of the bootstrap capacitor, additional components such as a buck or boost converter can be added as shown in FIG. 4. Here a boost converter comprising a boost inductor 80 and a boost diode 90 boosts charges from a supply to re-charge the boost capacitor 70'.

The addition of extra boost components, or increasing the size of the bootstrap capacitor, adversely affects the system efficiency and adds to the size, weight and complexity of the overall system.

The technique according to the disclosure, described below, avoids the need for larger capacitors or buck/boost components by essentially reducing the amount of capacitance needed to drive the switches.

The technique according to the disclosure modifies the use of the conventional bootstrap circuit such as shown in FIG. 3 by applying a very short pulse (in the microsecond range) to temporarily toggle the switching pattern of the low frequency switching leg of the inverter. This injection of a short ON pulse, while the output voltage 400 is negative, allows the bootstrap circuit to top up, replenishing the charge of the bootstrap capacitor 70. This means that the bootstrap capacitor 70 can continue to supply charge to the upper switch (i.e. Q3') during the negative output voltage so that the upper switch remains powered.

The control logic for the delivery of the pulse according to one method is shown in FIG. 5, where the polarity of the output voltage Vout is detected 600 and is provided to an AND gate 700. A pulse of predefined width and timing is provide to the other input of the AND gate 700. When the polarity of the output voltage is determined to be negative, the AND gate applies a short pulse of the predefined width and timing to toggle or reverse the switching pattern of the low frequency switches Q3' and Q4' and to turn the high frequency switches Q1' and Q2' temporarily off (to avoid a short circuit). In this short time, the bootstrap capacitor will re-charge.

An alternative technique that can be used to apply a short charging pulse is shown in FIG. 6. Here, the charging pulse is applied only during the dead time or OFF time of the high frequency switches and when the bootstrap capacitor voltage drops below the switching device turn-on voltage threshold. The bootstrap capacitor voltage is compared, 800, with the gate ON threshold voltage and the result of the comparison is provided to one input of an AND gate 700'. The outputs of the two high frequency switches (Q1', Q2') are provided to the inputs of a NOR gate 900. If neither high-frequency switch is high (dead time) and if the bootstrap capacitor voltage is less than the threshold, the switching pattern of the low frequency switches (Q3', Q4') is toggled. This approach works in systems where the switching frequency of the high frequency switches is relatively low (e.g. 200 kHz so that the dead time is long enough to fit in the short re-charging pulse.

FIGS. 7A and 7B and 8A and 8B show, from tests, how the operation of the inverter is improved using the application of a short re-charging pulse according to the disclosure. As seen in FIG. 7A, for the conventional bootstrap operation, when the charge stored in the bootstrap capacitor 70 is too low, the bootstrap circuit cannot maintain the upper switch Q3' powered on for the duration of the negative period. The switch is therefore forced to switch off to recharge the bootstrap capacitor which results in oscillations seen in the graphs. In contrast, as seen in FIG. 7B, using the techniques of this disclosure, the short re-charging pulse x is applied at a time just before it would be otherwise expected that the switch would be force off and the oscillations are, therefore, avoided.

Similarly, the FFT graphs are shown in FIGS. 8A and 8B for comparison and it can be seen that for the present technique (FIG. 8B) there are fewer and more uniform harmonic voltages.

The pulse width, bootstrap charging current and the number of times the pulse is applied can be varied according to the application and the size of the bootstrap capacitor.

The technique of this disclosure improves the efficiency of the inverter whilst minimising its size and weight. The overall system start-up and re-charging times are reduced and large spikes are avoided during the bootstrap capacitor re-charging. The modification can be implemented as an analogue or digital circuit and no additional components are required.

The invention claimed is:

1. An H-bridge circuit comprising:
   a first set of two series connected switches arranged to switch on and off at a first frequency; and
   a second set of two series connected switches in parallel with the first set and arranged to switch on and off at a second frequency; and
   a first bootstrap gate drive charging circuit, arranged to drive the second set of switches;
   wherein the second set of two series connected switches includes an upper switch ($Q_U$) and a lower switch ($Q_L$) connected in series,
   wherein the first bootstrap gate drive charging circuit is configured to provide an AC output voltage by alternatively turning on and off according to a predetermined duty cycle of alternate upper switch turn-on and lower switch turn-on phases, the bootstrap gate driver charging circuit comprising:
   an input terminal;
   an output terminal;
   a bootstrap capacitor;
   a charging path; and
   an H-bridge inverter with an inverter input and an inverter output, wherein the inverter input is electrically connected to the input terminal, the inverter output is electrically connected to a first end of the bootstrap capacitor, the charging path is electrically connected between a second end of the bootstrap capacitor and a gate driver supply voltage;
   wherein in response to the lower switch being turned ON and the bootstrap charging circuit provides a path to ground with respect to the gate driver supply voltage and in response to the lower switch being turned off, the bootstrap gate driver charging circuit provides a sufficient voltage level to maintain the upper switch ON for a duration of the upper switch turn-on phase by toggling the upper and lower switches for a short period of time during the upper switch turn-on phase, so as to maintain a charge of the bootstrap capacitor during the upper switch turn-on phase.

2. The H-bridge circuit of claim 1, wherein the toggling of the upper and lower switches is performed using a logic circuit configured to detect the polarity of the output voltage and, in response to detection that a polarity is negative, applying a predefined pulse to reverse the ON/OFF states of the upper and lower switches for a predetermined short period of time.

3. The H-bridge circuit of claim 2, wherein the predetermined short period is in a microsecond range.

4. The H-bridge circuit of claim 3, wherein the predetermined short period is 1 µs.

5. The H-bridge circuit of claim 1, wherein the toggling of the upper and lower switches is performed using a logic circuit configured to determine when a voltage across the bootstrap capacitor falls below a predetermined threshold voltage and, in response thereto, reversing the ON/OFF states of the upper and lower switches for a predetermined short period of time.

6. The H-bridge circuit as claimed in claim 1, further comprising a second bootstrap gate drive charging circuit, arranged to drive the first set of switches.

7. The H-bridge circuit as claimed in 6, wherein the first set of switches are a different type of switch to the second set of switches.

8. The H-bridge circuit as claimed in claim 7, wherein the first set of switches are Si switches and the second set of switches are SiC or GaN switches.

9. The H-bridge circuit as claimed in claim 1, wherein the second frequency is lower than the first frequency.

10. The H-bridge circuit as claimed in claim 1, wherein the first bootstrap gate drive charging circuit is configured to reverse the ON/OFF states of the second set of switches when the first set of switches are OFF.

11. A method of controlling power supply to a gate drive of switches of the H-bridge circuit as recited in claim 1 comprising upper and lower switches, by means of a bootstrap gate drive charging circuit, the method comprising:
    reversing ON/OFF states of the upper and lower switches for a predetermined short period of time depending on an H-bridge circuit output voltage.

* * * * *